United States Patent
Harkness, IV et al.

(10) Patent No.: US 7,166,320 B1
(45) Date of Patent: Jan. 23, 2007

(54) POST-DEPOSITION ANNEALED RECORDING MEDIA AND METHOD OF MANUFACTURING THE SAME

(75) Inventors: Samuel D. Harkness, IV, San Francisco, CA (US); Jie Zou, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 304 days.

(21) Appl. No.: 09/781,978

(22) Filed: Feb. 14, 2001

Related U.S. Application Data

(60) Provisional application No. 60/182,427, filed on Feb. 14, 2000.

(51) Int. Cl.
*B05D 5/12* (2006.01)

(52) U.S. Cl. .................................. 427/130; 427/131

(58) Field of Classification Search ................ 427/129, 427/130, 131, 132, 383.1, 404, 127; 428/800, 428/831, 832, 832.1, 832.2, 833, 833.1, 836, 428/836.1, 846; 360/131
See application file for complete search history.

(56) References Cited

U.S. PATENT DOCUMENTS

| | | | |
|---|---|---|---|
| 5,479,382 A * | 12/1995 | Nishida et al. | 369/13.35 |
| 5,571,591 A * | 11/1996 | Brady et al. | 428/848.8 |
| 5,843,569 A | 12/1998 | Kaitsu et al. | |
| 5,851,852 A | 12/1998 | Ostop et al. | |
| 5,985,404 A | 11/1999 | Yano et al. | |
| 5,989,728 A | 11/1999 | Coffey et al. | |
| 6,013,161 A | 1/2000 | Chen et al. | |
| 6,033,491 A * | 3/2000 | Lin | 148/108 |
| 6,117,282 A * | 9/2000 | Kuo et al. | 204/192.2 |
| 6,127,017 A | 10/2000 | Hirata et al. | |
| 6,143,388 A * | 11/2000 | Bian et al. | 428/832.2 |
| 6,307,241 B1 * | 10/2001 | Awschalom et al. | 257/421 |
| 6,403,241 B1 * | 6/2002 | Chen et al. | 428/832.2 |
| 6,432,562 B1 * | 8/2002 | Wu et al. | 428/694 TS |

OTHER PUBLICATIONS

Harkness, IV et al., "Recording performance enhancement via *in-situ* annealing of multilayer media structures", presented at 8th Joint MMM-Intermag Conference, Jan. 11, 2001.

\* cited by examiner

*Primary Examiner*—William Phillip Fletcher, III
(74) *Attorney, Agent, or Firm*—Morrison & Foerster LLP

(57) ABSTRACT

A novel technique for incorporating rapid thermal annealing into media sputter fabrication has facilitated the production of flyable media samples. Discs are fabricated with standard processing techniques to control physical grain size and crystallite texture. A CrMn caplayer ranging in thickness between 0.5 and 5 nm is subsequently deposited to provide the Mn-diffusant necessary to achieve post-treatment exchange de-coupling. While still in-situ and before application of protective overcoats, the discs are exposed to temperatures between 200° C. and 350° C. compatible with most media production processes. A threefold increase in coercive force (peak reaching ~3800 Oe) and 10 dB improvement in medium signal-to-noise ratio is observed for the optimized process.

2 Claims, 6 Drawing Sheets

Vacuum Processing Scheme

POST-DEPOSITION ANNEALED RECORDING MEDIA AND METHOD OF MANUFACTURING THE SAME

RELATED APPLICATIONS AND PUBLICATIONS

This application claims priority from Provisional Application Ser. No. 60/182,427 filed Feb. 14, 2000, entitled "METHOD TO MANUFACTURE RECORDING MEDIA USING POST-DEPOSITION ANNEALING," the entire disclosure of which is hereby incorporated herein by reference. The inventors prior publication entitled "Recording Performance Enhancement via in-situ Annealing of Multi-layer Media Structures," published Jan. 11, 2001, at the 8$^{th}$ Joint MMM-Intermag Conference, is hereby incorporated herein by reference.

FIELD OF INVENTION

This invention relates to magnetic recording media, such as thin film magnetic recording disks, and to a method of manufacturing the media. The invention has particular applicability to high areal density magnetic recording media exhibiting low noise, and high coercivity.

BACKGROUND OF THE INVENTION

The increasing demands for higher areal recording density impose increasingly greater demands on thin film magnetic recording media in terms of remanent coercivity (Hr), magnetic remanance (Mr), coercivity squareness (S*), medium noise, i.e., signal-to-medium noise ratio (SMNR), and narrow track recording performance. It is extremely difficult to produce a magnetic recording medium satisfying such demanding requirements.

The linear recording density can be increased by increasing the Hr of the magnetic recording medium, and by decreasing the medium noise, as by maintaining very fine magnetically non-coupled grains. Medium noise in thin films is a dominant factor restricting increased recording density of high-density magnetic hard disk drives, and is attributed primarily to inhomogeneous grain size and intergranular exchange coupling. Accordingly, in order to increase linear density, medium noise must be minimized by suitable microstructure control.

It is recognized that the magnetic properties, such as Hr, Mr, S* and SMNR, which are critical to the performance of a magnetic alloy film, depend primarily upon the microstructure of the magnetic layer which, in turn, is influenced by the underlying layers, such as the underlayer. It is also recognized that underlayers having a fine grain structure are highly desirable, particular for growing fine grains of hexagonal close packed (HCP) Co-alloys deposited thereon.

Previous attempts to improve the SMNR and coercive force with increasing areal density have used ex situ post-deposition annealing of the magnetic thin film to reduce anisotropy without increasing grain size. Such attempts have met with limited success in providing a suitable product with increased coercivity, however, due to the introduction of environmental contaminants and the need to expose the thin film to high temperatures over a relatively long period of time to achieve satisfactory results. The annealing conditions employed have subjected the thin film to oxygen and, thereby, required the use of thick caplayers. The thick caplayers of the prior art result in unacceptable head-to-media spacing that can interfere with the operation of devices employing this type of recording media such as hard disk drives.

In U.S. Pat. No. 5,989,728 to Coffey et al., an ex situ post-deposition annealing process is described in which a CoPt thin film of 25 nm to 200 nm is annealed at 550° C. to 750° C. for approximately 10 minutes. Coffey states that it is preferable, however, to anneal the thin film at 650° C. to 700° C. Further, the annealing process of Coffey requires the use of a quartz lamp furnace with flowing Ar/4% H$_2$ gas to prevent oxidation.

In U.S. Pat. No. 6,117,282 to Kuo et al., a method for producing a Magnetic recording medium thin film is described wherein the CoTb magnetic layer is protected by a SiNx layer having a thickness of approximately 10 nm and annealed at 250° C. for approximately 60 minutes in a vacuum furnace. Kuo et al. do not describe the signal characteristics or SMNR of their described recording media. The major disadvantages of the Kuo process are the following. First, annealing is performed in a vacuum furnace, which is ex situ from the sputtering chamber in which the SiNx layer was deposited. When annealing is performed ex situ, it is intractable to prevent oxygen from entering the magnetic layer, thus deteriorating the performance of the recording media. Second, the large energy requirement to maintain the annealing temperature for a long period of time, greatly increasing the cost of the recording medium.

It would therefore be desirable to have a magnetic recording medium with a minimal Cr content that exhibits high coercivity and a high signal to medium noise ratio.

It would also be advantageous to have a method of producing a recording medium that provides a magnetic recording medium with a high linear recording density, high signal to noise ratio, and high coercivity that can be integrated into current manufacturing processes economically and efficiently where the recording medium does not need to be exposed to high energy sources for long periods of time or removed or subjected to multiple manufacturing process such as the ex situ annealing process of Coffey.

In short, there exists a need for a process if manufacturing a magnetic recording medium in accordance with the criteria stated above that does not achieve increased coercivity through grain coarsening or increasing Cr content.

SUMMARY OF THE INVENTION

One embodiment of this invention is a magnetic recording medium, comprising a substrate, a magnetic recording layer and a caplayer, wherein the caplayer has been annealed in situ. "In situ" annealing means that the medium was annealed during the manufacturing process without having to remove the medium from a sputtering system to a separate location. Preferably, the in situ annealing is at a temperature of from about 150° C. to about 550° C. for a period of from about 10 seconds to about one minute.

The caplayer could comprise CrMn and have a thickness of from about 0.5 μm to about 5 nm, and wherein less than about 15 at. % of the caplayer is Cr. The medium could have Mrt/Hcr less than about 50 or 20 nm. The medium could have SMNR of about 5 dB greater than that of another medium except wherein the caplayer is not annealed. The medium could SMNR of about 12 dB or more. The medium could have Mrt of less than about 0.6 memu/cm$^2$ and an Hcr of greater than about 2000 or 3000 kOe.

Another embodiment of this invention is a method of manufacturing a magnetic recording medium, comprising depositing a magnetic recording layer on a substrate, depositing a caplayer on the magnetic recording layer and annealing the caplayer in situ at a temperature of from about 150° C. to about 550° C. The method could further comprise depositing a layer comprising CoCrPt on the substrate prior to depositing the caplayer. The method could further comprise depositing a protective layer on the caplayer after annealing. The annealing could be carried out at from about 250° C. to about 350° C. The annealing could be carried out for less than about 30 seconds. In a preferred embodiment, the annealing is carried out for about 14 seconds at a temperature of about 300° C.

Another embodiment of the process could further comprise depositing a sub-seed layer on the substrate; depositing a seed layer on the substrate; depositing an underlayer on the seed layer and depositing a intermediate layer on the underlayer; wherein the magnetic layer is deposited on the intermediate layer.

The magnetic layer could comprise at least one of Co, Cr, B, Pt, Ta, and Nb. The magnetic layer could comprise a layer of CoCrPt having a thickness of from about 100 nm to about 400 nm.

Another embodiment is a magnetic recording medium, comprising a magnetic recording layer and means for low noise recording. The means for low noise recording includes an annealed layer on the magnetic layer and equivalents thereof. Preferably, the annealed layer comprises CrMn and has been annealed in situ.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims. As will be realized, the present invention is capable of other and different embodiments, and its several details are capable of modifications in various obvious respects, all without departing from the present invention. The drawings and description are to be regarded as illustrative in nature, and not as restrictive.

Figure 1:
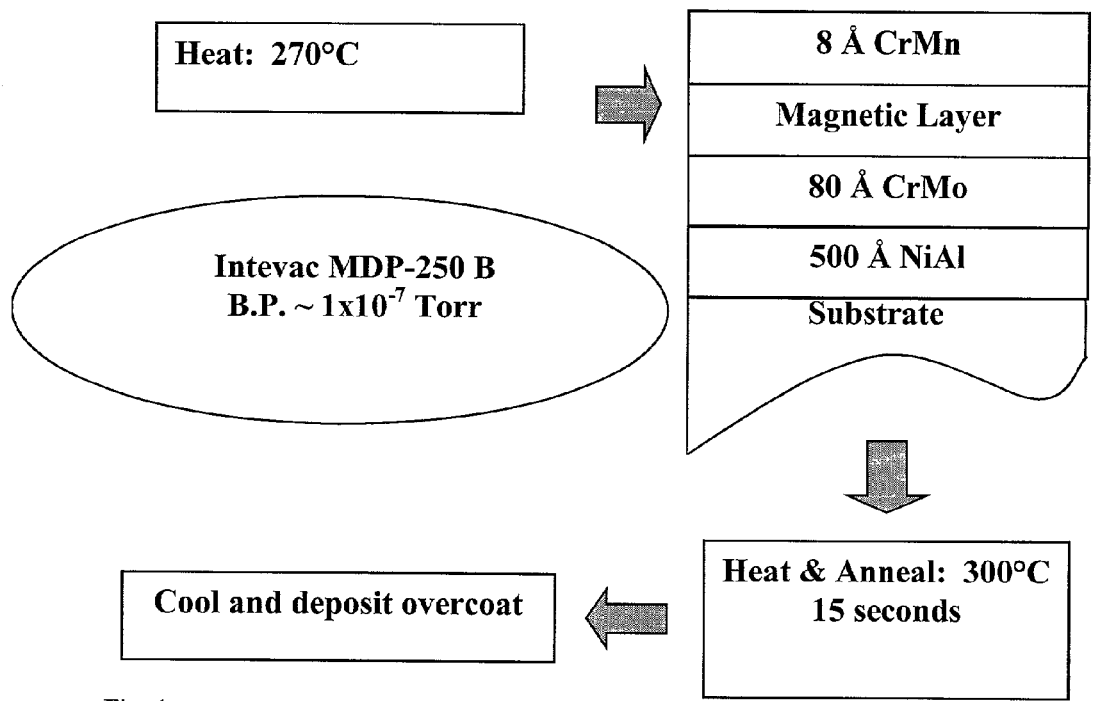
FIG. 1. A schematic representation of a process to produce flyable recording media having been processed with post-deposition annealing.

The invention will be better understood by reference to the Detailed Description of the Invention when taken together with the attached drawings.

DETAILED DESCRIPTION OF THE INVENTION

It has been found that a magnetic recording film having high coercivity can be produced without increasing the grain size of the magnetic layer while maintaining the Cr content below about 15 at. % (atomic percent). Through a novel application of the process of post-deposition annealing, recording media employing larger magnetic alloys can be produced with very high linear recording densities and high signal-to-medium-noise ratio (SMNR).

According to one embodiment of the invention, the recording media of the present invention has a caplayer ranging in thickness of from about 0.5 nm to about 5.0 µm deposited on the magnetic layer of the medium by maintaining a system base pressure of $1 \times 10^{-7}$ Torr with less than 50% partial pressure from background water and then using depositing means such as a disc sputtering system. Preferred is the Intevac MDP-250B system. To obtain a multilayer structure, the depositing means may also include a standard dc-magnetron-sputtering unit.

Using the disc sputtering system in conjunction with a standard DC-Magnetron sputtering unit, a multilayer structure could be applied to a super-polished glass-ceramic substrate beginning with a NiAl-based seedlayer, a Cr-based underlayer, and a CoCrPt magnetic layer. A caplayer is applied on the magnetic layer. The caplayer ranges in thickness from 0.5 to 5 nm.

The caplayer and the caplayer means should have a Cr content of less than about 15 at. % and preferably comprises CrMn. Once the caplayer has been deposited on the magnetic layer, the recording medium is annealed in situ. The preferred means for annealing the caplayer is an infrared heater in the range of 10–20 kW installed in the medium processing sequence to permit in situ heating of the medium during fabrication. In a preferred embodiment, a 12 kW infrared heater is used to allow the caplayer to be subjected to 250° C.–300° C. for a period not to exceed 15 seconds. Preferably the caplayer has a thickness of about 0.8 nm and is annealed for 15 seconds at 300° C.

Prior to the deposition of the caplayer, a magnetic recording medium can be prepared which comprises a substrate means for supporting a magnetic recording film and a magnetic recording means for recording data, wherein the magnetic recording means is located on the substrate means and comprises CoCrPt, CoCrPtB, or CoPtTaB, with CoCrPt being preferred. The substrate means includes any substrate such as a glass, glass-ceramic, NiP/aluminum, metal alloys, plastic/polymer material, ceramic, glass-polymer, composite materials or other non-magnetic materials. The magnetic recording means is a material capable of being magnetized, typically in the form of a magnetic layer.

The magnetic recording film comprises a sub-seed layer of a thickness of about 10 Å to about 1000 Å, a seed layer of a thickness of about 10 Å to about 2000 Å, an underlayer of a thickness of about 10 Å to about 1000 Å, an intermediate layer of a thickness of about 1.5 Å to about 150 Å, and a magnetic layer of a thickness of about 100 Å to about 400 Å.

In a preferred embodiment, the thickness of the seedlayer is 200 Å to about 1600 Å, preferably between 300 Å and 1200 Å, and most preferably about 600 Å. The thickness of the underlayer is 12 Å to about 500 Å, preferably between 15 Å and 250 Å, and most preferably about 25 Å. The thickness of the magnetic layer is 150 Å to about 250 Å, preferably between 175 Å and 225 Å, and most preferably about 200 Å. The thickness of the protective layer is 20 Å to about 300 Å, preferably between 30 Å and 100 Å, and most preferably about 50 Å. The protective layer is made of hydrogenated carbon ($CH_x$).

The magnetic recording medium has a remanent coercivity of about 2000 to about 10,000 Oersted, and an Mrt (product of remanance, Mr, and magnetic layer thickness, t) of about 0.2 to about 2.0 memu/cm². In a preferred embodiment, the coercivity is about 2500 to about 9000 Oersted, more preferably in the range of about 3000 to about 6000 Oersted, and most preferably in the range of about 3350 to about 5000 Oersted. In a preferred embodiment, the Mrt is about 0.25 to about 1 memu/cm², more preferably in the range of about 0.3 to about 0.7 memu/cm², and most preferably in the range of about 0.3 to about 0.6 memu/cm².

This invention will be better understood with reference to the following examples, which are intended to illustrate specific embodiments within the overall scope of the invention as claimed.

EXAMPLES

Example 1

Media samples were fabricated using an Intevac MDP-250B disc sputtering system (FIG. 1), which in this example was both the means for depositing on a substrate a caplayer and the means for annealing the caplayer. System base pressure (B.P.) was maintained below $1 \times 10^{-7}$ Torr with <50% partial pressure from background water. Standard dc-magnetron sputtering units were used in conjunction with the system to apply regular media multilayer structures generally composed of NiAl-based seedlayers, Cr-based underlayers and various magnetic layers to super-polished Ohara glass-ceramic substrates. CoCrPt, CoCrPtB, and CoPtTaB magnetic compositions were selected based on inherently high exchange coupling, wide grain boundary width, and narrow grain boundary width respectively. Deposition substrate temperature was maintained at 270° C. Crystallite sheet texture for all structure-types fabricated was confirmed to be (112) for the sublayer and (10.0) for corresponding magnetic layers using x-ray diffraction (XRD). In addition to the standard multilayer configuration, a caplayer of CrMn was applied to the top surface of the magnetic layer. A caplayer of CrMn is applied to the magnetic layer with a thickness of 0.8 nm and annealed in situ with a 12 kW infrared heater at 300° C. for 15 seconds. Additional samples were processed ex-situ using a Modular Process Technology RTP-6005 capable of reaching temperatures of 1200° C.

Recording parametrics were measured using a Guzik 1701MP spinstand tester and magnetic properties were determined from vibrating sample magnetometer (VSM) measurements. Microstructural data was collected from transmission electron microscopy (TEM), and XRD.

Figure 2:
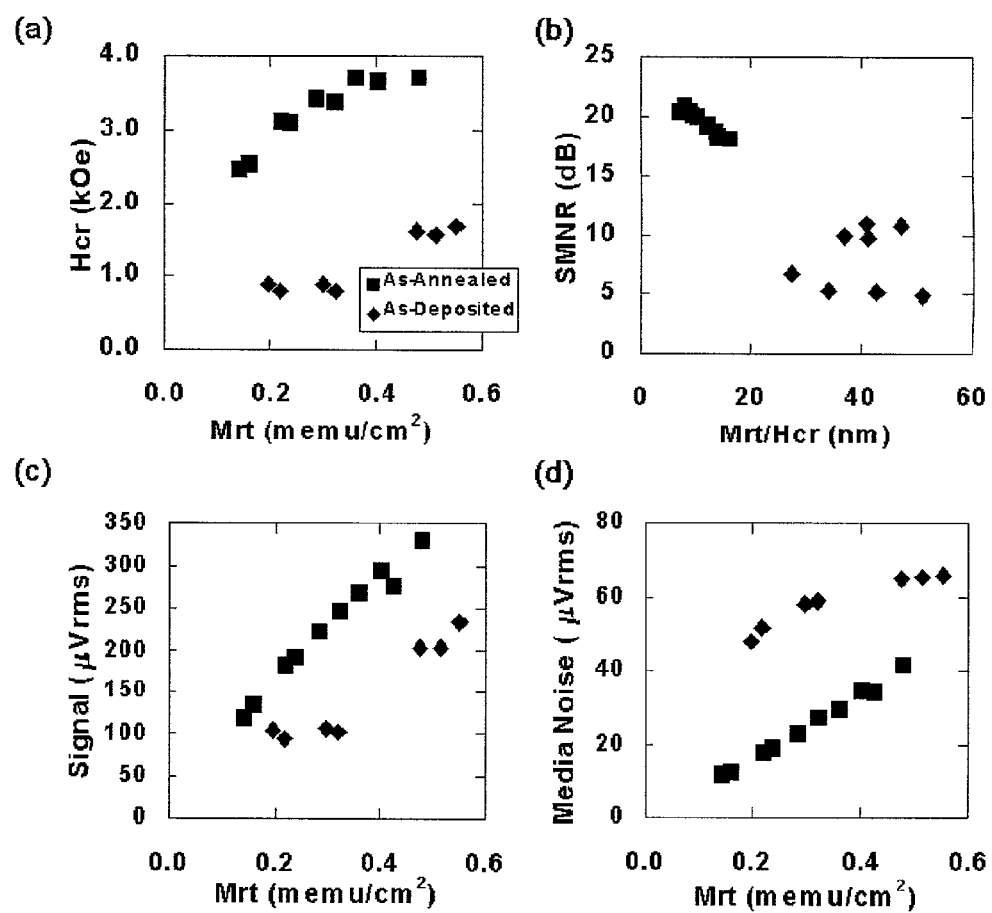
FIG. 2(a). An illustration of Hcr vs. Mrt for as-deposited and as-annealed samples.
FIG. 2(b). Further illustration of Hcr vs. Mrt for as deposited and as-annealed samples.
FIG. 2(c). A graphical representation of the SMNP vs. Mrt/Hcr for as-deposited and as-annealed samples.
FIG. 2(d). A graphical representation of signal strength vs. Mrt for as-deposited and as-annealed samples.

Shown in FIG. 2(a) is the coercive force of the as-deposited and as-annealed samples for media having CrMn/CoCrPt/Cr/NiAl multilayer structures, with a caplayer of 0.8 nm of CrMn. The annealed sample was in-situ post annealed at 300° C. for 15 seconds. The data show that annealing greatly boosts the coercive force of the as-deposited samples. A peak of 3809 Oe is reached at 0.43 memu/cm² with an s* of 0.82 compared to ~1000 Oe with s* equal to 0.90 for the as-deposited samples. The decrease in s* is indicative of a decrease in intergranular exchange field coupling as the magnetic grains tend more toward Stoner-Wolfarth-like particles. There is also a perceptible shift to lower Mrt when samples are annealed. VSM measurements confirm a 16% drop in $M_s$ due to annealing. This is attributed to migration of Mn atoms into the bulk core of the grain from both the grain boundary and the caplayer. Chromium dilution of the core is disregarded due to the observation that the magnetization was not significantly affected by thermal treatment of CoCrPt films without a caplayer. Since the caplayer thickness, 8 Å is similar to that of the grain boundary, the concentration gradients would be approximately equivalent for Cr into the grain. Therefore, it is reasonable to assume that a pure Cr caplayer would not change the results.

Plotted in FIG. 2(b) is the SMNR vs. Mrt/Hcr (an analog of the transition parameter) for both sample groups. The corresponding signal and noise of the two sample groups are shown in FIG. 2(c) and FIG. 2(d), respectively. The data show that annealing increases the signal and reduces the noise therefore resulting in higher SMNR. Comparing samples of the same original Mrt, the SMNR gain is as large as 10 dB, or 216% improvement. This phenomenon is the result of the diffusion of CrMn from the caplayer to the grain boundary thereby greatly reducing the exchange coupling among grains. This granular decoupling then results in better transition sharpness and therefore more signal and less noise. This is consistent with the model given by Bertram in H. N. Bertram, *Theory of Magnetic Recording*, Cambridge, 1994, p. 130, wherein the signal, $V \propto e^{-a}$, where, a, is the transition parameter.

Figure 3:
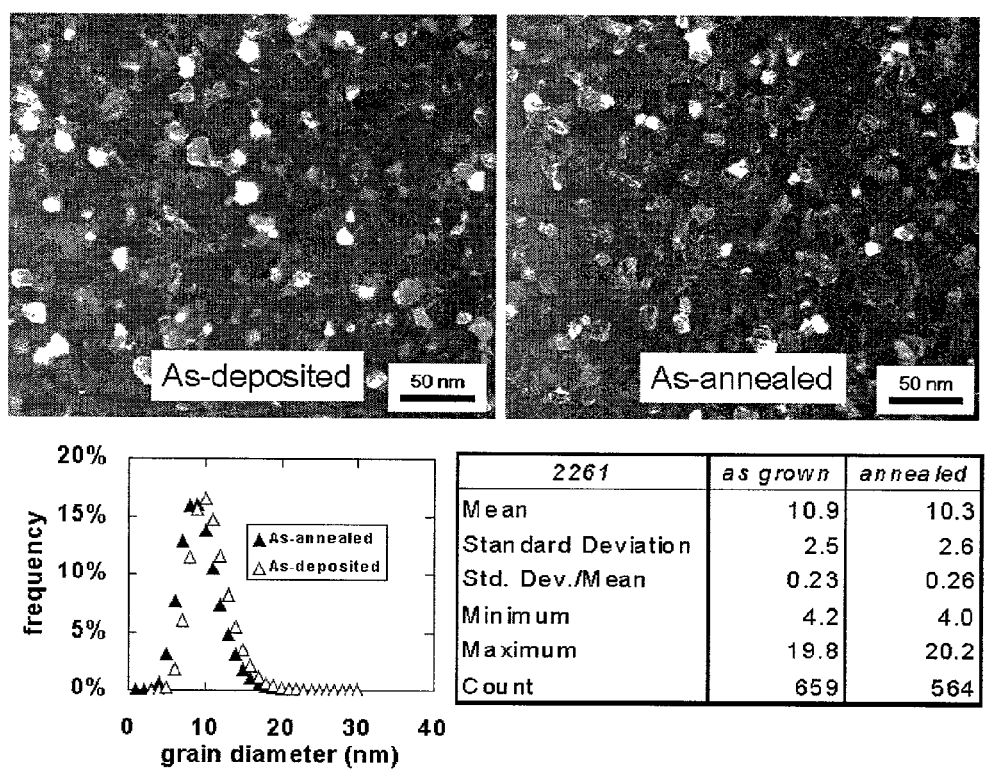
FIG. 3. Grain size analysis from plan view dark field TEM showing that for the annealed samples there is no grain coarsening or change in granular morphology observed within statistical confidence.

Grain size analysis was performed for the above samples to rule out the possibility of the higher coercive force arising from grain coarsening. In FIG. 3, micrographs for both as-deposited and as-annealed are shown with comparative statistics. It is observed that there is no statistical difference between the two mean grain sizes. Therefore, it is reasonable to conclude that the increase in coercive force due to annealing is a result of the magnetic particles tending more toward single-domain with a coherent rotation mechanism of switching. The data confirms that the annealing process of this invention does not cause an increase in grain size, unlike previous attempts to use annealing to produce a high coercivity magnetic film with a low Cr content in the magnetic layer which employed higher temperatures and/or longer annealing times.

Comparative Example 1

Figure 4:
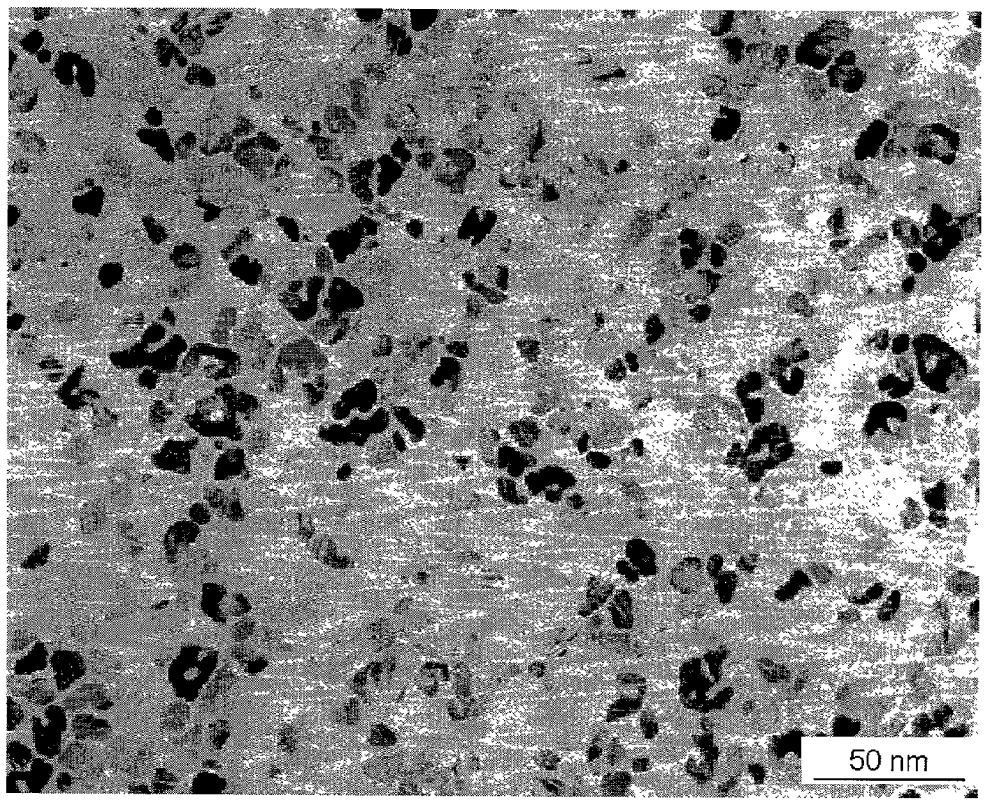
FIG. 4. Plan view TEM micrograph showing distinct and wide grain boundaries typical of CoCrPtB magnetic alloys.

The same post-deposition annealing process of Example 1 was applied to a composition identical in Cr, and Pt level as in the CoCrPt alloy with the addition of a few atomic percent of B as it has been observed that B tends to increase effective grain boundary width. This is shown in the plan-view TEM micrograph in FIG. 4. The grains in this figure are clearly delineated by the amorphous registering region interposed. The width of these boundaries is much greater than was shown in FIG. 3 (or than will be shown in FIG. 6). However, these samples were unresponsive to the usable range of in-situ annealing temperatures (200–450° C.) in terms of Hcr, or SMNR enhancement.

Table 1 shows the performance data of media in which the CoCrPtB layer is as-deposited and as in-situ annealed post deposition. The as-annealed samples were exposed to 400° C. for 15 seconds.

TABLE 1

Effect of Post Deposition Annealing on CoCrPtB.

| Sample | Mrt memu/cm$^2$ | Hcr Oe | SMNR dB | pw50 μin |
|---|---|---|---|---|
| As-deposited | 0.45 | 3037 | 17.2 | 8.0 |
| As-annealed | 0.45 | 3033 | 17.3 | 8.0 |

Comparative Example 2

A Cr-less alloy, CoPtTaB was also investigated as a viable sample containing relatively small grain boundary width. Again, it was not possible to anneal with any effect on recording properties in-situ.

Comparative Example 3

Figure 5:
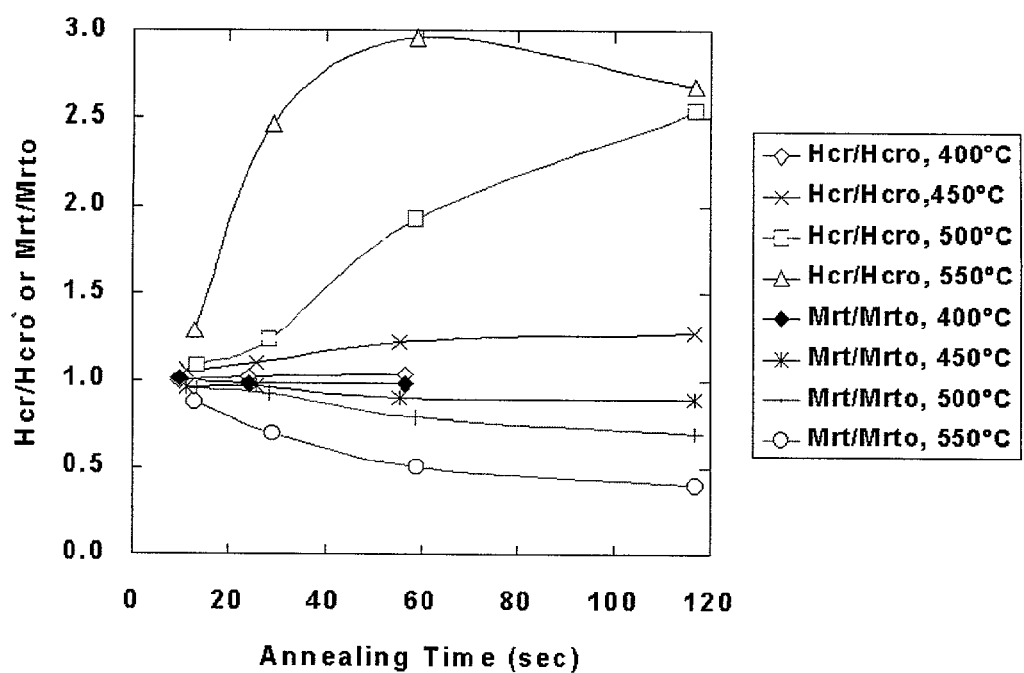
FIG. 5. CoPtTaB Hcr and Mrt normalization curves for various annealing temperatures as a function of annealing duration (normalized to room temperature values).
Figure 6:
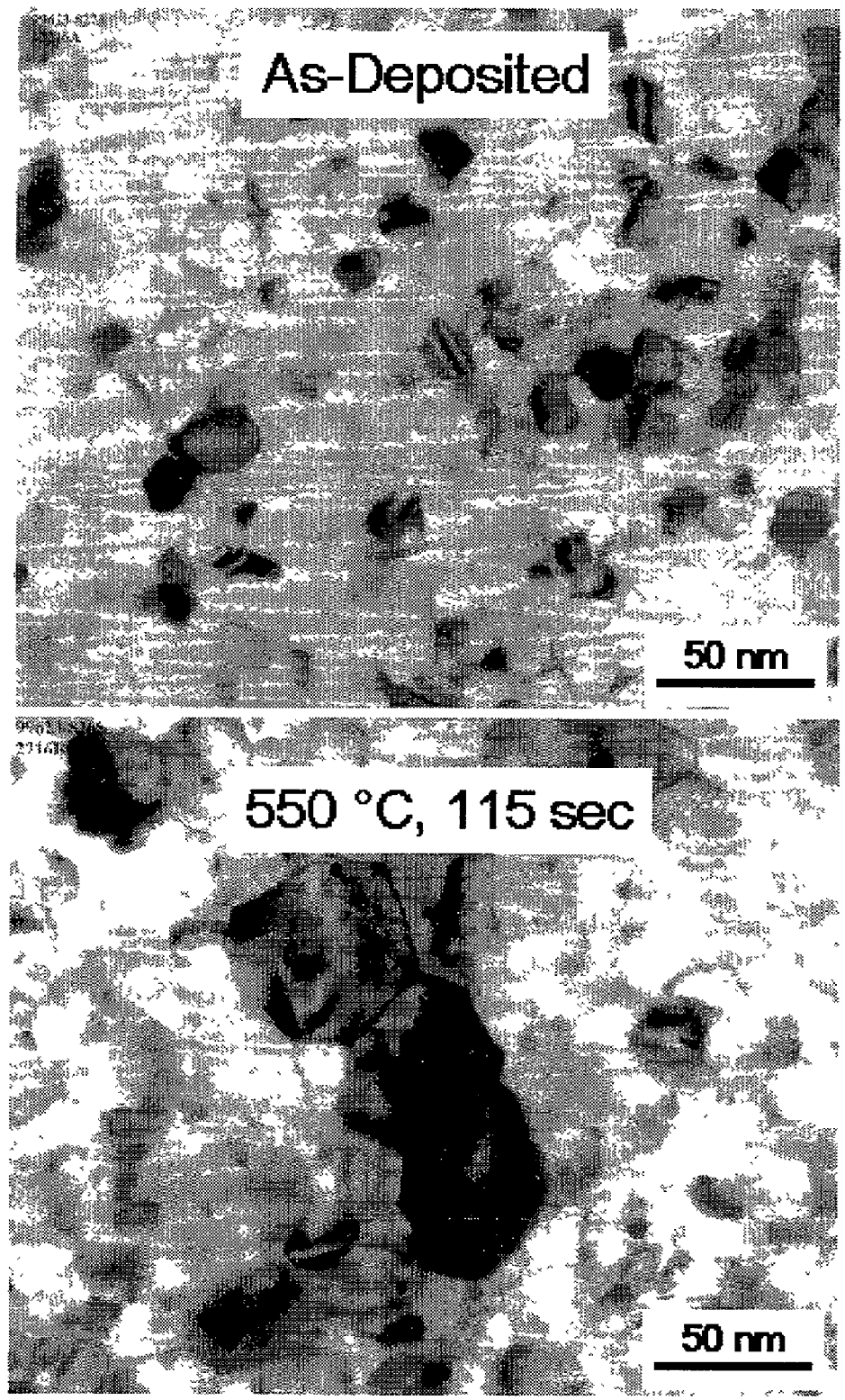
FIG. 6. Plan view of a bright field TEM micrographs of as-deposited and annealed at 550° C. for 115 sec CrMn/CoCrPtTaB/Cr/NiAl samples showing significant grain coarsening from extreme thermal treatment.

Samples were annealed ex-situ to determine the threshold for coercive force increase. In FIG. 5 it is observed that above 400° C. annealing temperature and 15 seconds duration time, the coercive force finally begins to increase. The peak occurs for 550° C. and 60 seconds. Commensurate decrease in Mrt for all samples analyzed is slight compared to the large increase in coercive force. It is also observed that for the annealing condition: 550° C., 115 sec., the coercive force has decreased from the peak value ~11%. In FIG. 6 bright field TEM images show qualitatively, but clearly that for this particular thermal treatment there is grain coarsening occurring.

Comparative Example 4

The recording medium of Comparative Example 4 is the same as that of Example 1 except the caplayer was omitted from the structure. It was observed that here was no observable change in the magnetic performance of the recording medium of Comparative Example 4 after the in-situ post anneal similar to that of Example 1.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. The entire disclosure of the patents and publications referred in this application are hereby incorporated herein by reference.

What is claimed is:

1. A method of manufacturing a magnetic recording medium, comprising:
    depositing a magnetic recording layer on a substrate,
    depositing a caplayer on the magnetic recording layer and
    annealing the caplayer in situ at a temperature of from about 150° C. to about 550° C. thereby manufacturing said magnetic recording medium, wherein the caplayer comprises Cr and wherein the caplayer further comprises Mn.

2. The method of claim 1, wherein the Cr content is less than 15 atomic percent.

* * * * *